United States Patent
Otto, IV et al.

(10) Patent No.: US 12,261,053 B2
(45) Date of Patent: Mar. 25, 2025

(54) SUBSTRATE PROCESSING WITH SELECTIVE ETCHING

(71) Applicant: TOKYO ELECTRON LIMITED, Tokyo (JP)

(72) Inventors: Ivo Otto, IV, Albany, NY (US); Subhadeep Kal, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 335 days.

(21) Appl. No.: 17/885,228

(22) Filed: Aug. 10, 2022

(65) Prior Publication Data
US 2024/0055268 A1    Feb. 15, 2024

(51) Int. Cl.
*H01L 21/311* (2006.01)
*H01J 37/32* (2006.01)
*H01L 21/02* (2006.01)

(52) U.S. Cl.
CPC .. *H01L 21/31116* (2013.01); *H01J 37/32449* (2013.01); *H01L 21/0217* (2013.01); *H01L 21/02532* (2013.01); *H01J 2237/3341* (2013.01)

(58) Field of Classification Search
None
See application file for complete search history.

(56) References Cited

U.S. PATENT DOCUMENTS

| 10,529,581 B2 | 1/2020 | Hsu et al. |
| 10,923,356 B2 | 2/2021 | Kal et al. |
| 2016/0379835 A1 | 12/2016 | Kal et al. |
| 2017/0271165 A1* | 9/2017 | Kal .................. H01L 21/31116 |

FOREIGN PATENT DOCUMENTS

| KR | 20200090244 A | 7/2020 |
| WO | 2018195423 A1 | 10/2018 |

OTHER PUBLICATIONS

Li, Junjie et al., "Study of Silicon Nitride Inner Spacer Formation in Process of Gate-all-around Nano-Transistors," Nanomaterials 2020, 10, 793, Apr. 20, 2020, 11 pages.
PCT International Search Report and Written Opinion, International Application No. PCT/US2023/026930, dated Oct. 23, 2023, 10 pages.
Xie, Lu, et al., "Strained Si0.2Ge0.8/Ge multilayer Stacks Epitaxially Grown on a Low-/High-Temperature Ge Buffer Layer and Selective Wet-Etching of Germanium," Nanomaterials 2020, 10, 1715; Aug. 29, 2020, doi:10.3390/nano10091715, www.mdpi.com/journal/nanomaterials, 12 pages.

* cited by examiner

*Primary Examiner* — Roberts P Culbert
(74) *Attorney, Agent, or Firm* — Slater Matsil, LLP

(57) ABSTRACT

Etching is selectively performed and selectively is modified using a treatment or pre-treatment with nitrogen radicals, prior to etching. Etching is performed with a gas phase chemistry etch. Different selectivities can also be provided in different processes or different regions (or different devices or different locations) of a substrate by the selective use and non-use of the treatment.

20 Claims, 8 Drawing Sheets

SUBSTRATE PROCESSING WITH SELECTIVE ETCHING

FIELD OF THE INVENTION

The invention relates to processing of substrates, for example, semiconductor substrates, and particularly to selective etching of layers or materials.

BACKGROUND

In various types of semiconductor architectures, selective etching of $Si_xGe_y$, Si, and Ge relative to each other is needed. Current methods can be unsatisfactory, in that selectivity is unsatisfactory, or steps to achieve selectivity can result in damage or unacceptable permanent modification of one or more of the layers or materials. In addition, achieving desired selectivity can be difficult in that, in some processes performed on a substrate, one material (a first material) might need to be etched selective to another material (for example, etching Ge with respect to $Si_xGe_y$, or Si), while in another portion of the substrate or processing, selective etching of the other material might be needed with respect to the first material (for example, selectively etching $Si_xGe_y$, or Si with respect to Ge).

SUMMARY

The invention provides for the treatment or pre-treatment of a material prior to etching so that selective etching can be performed of one material relative to another, for example, for selective etching of SiGe relative to Ge or Si, or conversely, for selective etching of Ge with respect to SiGe or Si, depending upon whether the pre-treatment is used.

In a preferred example, portions of the process are performed with a plasma to treat one or more layers of the substrate, and thereafter to provide selective etching. Preferably, ions are removed from the plasma before the plasma is used to treat the layers.

In an example, the treatment is performed with a plasma containing nitrogen, in which nitrogen ions of the plasma have been removed so that the treatment is performed with a plasma of nitrogen radicals. The etching is then performed with selectivity determined based upon whether a material has been treated or not. In addition, the treated surface (such as a nitride surface) can be removed during the etching and optional heat treatment. Although optional, it is presently preferred to additionally perform the heat treatment step after the etching.

The invention can be applied to various processes, including but not limited to, an indent process, a channel release process or a channel trim process.

Apparatus are also disclosed which are configured to perform selective etching as disclosed herein.

BRIEF DESCRIPTION OF THE DRAWINGS

The invention will be better appreciated and understood with reference to the detailed description herein in conjunction with the drawings in which.

DETAILED DESCRIPTION

Figure 1:
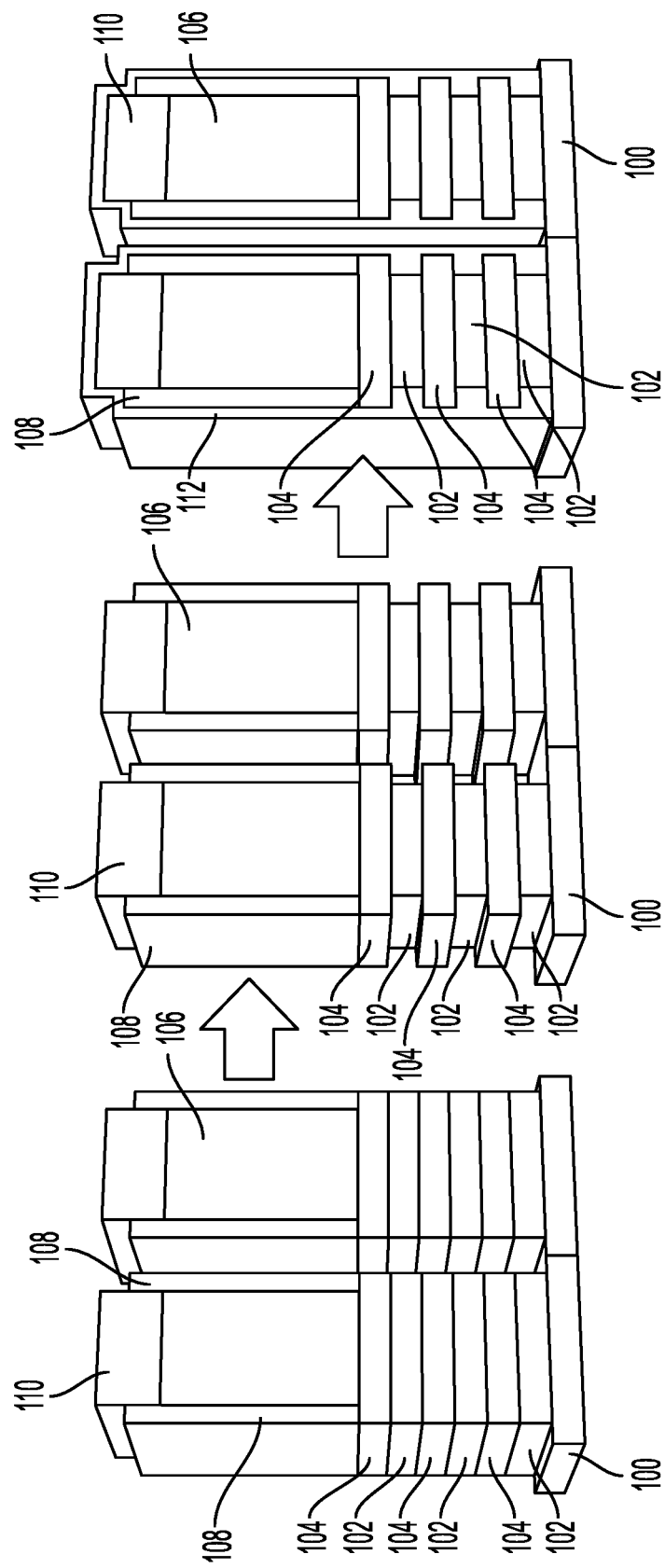
FIGS. 1A-1C illustrate a selective etching example.

The invention will be further appreciated according to the description of exemplary embodiments and advantages herein. It is to be understood that not every aspect of a particular example need be utilized to practice the invention, and therefore, a subset of features of particular examples could be utilized without utilizing other aspects. Similarly, advantages that can be achieved with the invention are also described herein, however, in practicing the invention, certain aspects or advantages may be utilized without others, or alternate advantages can be achieved.

In an example, the treatment or pre-treatment (before etching) is performed with a nitrogen plasma in which nitrogen ions have been removed, so that the treatment is performed with nitrogen radicals of the plasma. Although not limiting, in a presently preferred example, the plasma of nitrogen can be formed in a remote chamber or remote chamber portion, and then fed to another chamber or chamber portion in which the substrate is positioned, while removing nitrogen ions from the plasma. The chamber or chamber portion in which the substrate is positioned does not require additional excitation of the plasma or additional bias power, although power or biasing of the substrate holder can be provided for holding the substrate or attracting the substrate to the substrate holder (e.g., electrostatically with an electrostatic chuck). In addition, heating in the plasma formation chamber or chamber portion can be provided, and heating could also optionally be provided of the substrate and/or the portion of the chamber in which the substrate is positioned.

In the illustrated example of FIG. 1A, a device includes a base 100, which can include the base of a semiconductor wafer as well as additional layers, below the layers being processed as discussed herein. Above the base 100, layers are stacked in an alternating fashion, with the stacked layers including at least two different layers having different material compositions. For example, in the illustrated arrangement, a plurality of layers 102 are provided which contain a silicon material Si, the silicon-containing material of layer 102 can also include germanium Ge or other materials. In addition, alternating with the layers 102, are layers 104 which include germanium. The germanium in layer 104 is of a higher content than the germanium present in layer 102, and layer 104 can also be pure Ge or have a higher alloy amount of Ge. Layer 102 can have germanium in a lower percentage content or lower alloying amount compared to layer 104, or alternately, layer 102 can have no germanium present. Although two alternating layers 102, 104 are provided in this example, it is to be understood that the stack of alternating layers could have three or more different layers.

In this example, the layer 104 is provided with a treatment or pre-treatment so that a nitrided or nitrogen treated surface is formed on the side surfaces of the germanium or Ge layer 104, but the nitrides are either not formed or are formed in a lower amount (or lesser extent) upon the layers 102. The treatment with nitrogen radicals is selective to materials with higher amounts of Ge, so that later, selective etching of other layers (e.g., layers with lower amounts of Ge or no Ge) is performed with respect to the layers containing higher amounts of Ge. As used herein, providing a treatment of one layer or material which is selective to another layer or material means that the treated layer will have a higher amount of nitrogen or nitrides including at least one of a higher concentration of nitrogen on the surface of the material treated or protected, or a thickness of the nitrided layer or nitrided surface is larger compared to the other layer or material (for which nitrides are either not formed, or a nitrided layer has a smaller thickness or there is a lower nitrogen concentration on the surface).

In the illustrated example, element 106 can be, for example, a dummy gate formed of amorphous silicon (a-Si), elements 108 are gate spacers, and element 110 can be a mask, such as a hard mask. The gate spacers can be formed of SiN or a low-k dielectric. The mask 110 can be formed, for example, of SiO2 or SiN, and is formed of a material different from gate spacers 108.

After the treatment process, an etching step is performed to provide one or more indentations in each of the layers 102 in this example, with the indentations preferably formed on at least two sides of the layers 102. Indentations are provided on four sides in the example illustrated, so that the layers 102 are recessed or indented with respect to layers 104. However, the Ge layers 104 are not etched (or are not substantially etched), because they are protected by the nitride formed on the surface, i.e., the side surfaces in this example, so that the Si containing layers 102 (which contain either no germanium or germanium in a lower amount than layer 104) are etched by the etching process. The etching process is described in further detail herein. In a presently preferred example, the etching is by a gas phase chemistry without a plasma, or in other words, a plasma is not formed for the subsequent etching.

Preferably, the nitrogen treatment of the Ge layer 104 saturates the higher Ge containing layer. The process conditions during the treatment are such that there is no (or insubstantial) treatment or reaction of the silicon with nitrogen. For example, the process is not sufficiently energetic to form SiN from pure silicon. The nitrogen treatment with nitrogen radicals will have a high selectivity for pure Ge, or for higher alloy SiGe relative to SiGe having a lower alloy amount of Ge or having no Ge. For SiGe having an alloy amount of 30% or less Ge, there is little or no bonding or nitriding of the nitrogen to the SiGe material, and any nitriding can be readily removed during the subsequent etch or post-etch heat treatment. Accordingly, for the lower Ge alloy material, it can be preferable to have a Ge content of less than 30%. The presence of some Ge can be preferable for the gas phase etch (described later), because it will etch more rapidly, and therefore, it can be desirable to have, for example, at least 5% Ge. However, where the pure or higher alloy Ge layer is protected with the nitrogen radical treatment, a very low Ge alloy or Si material that does not include Ge can be used because, although this material will etch more slowly, it can be etched without damaging the pure Ge or higher alloy Ge layer due to the protection provided by the nitriding.

Thereafter, as shown in FIG. 1C, a spacer material 112 is deposited over the device to form an inner spacer layer so that the spacer material fills the indentations formed by the etched portions of layer 102 and between the layers 104. The spacer material 112 can be formed, for example, of a low-k dielectric, and is formed of a material different from the material of the gate spacers 108 and mask 110.

Figure 2:
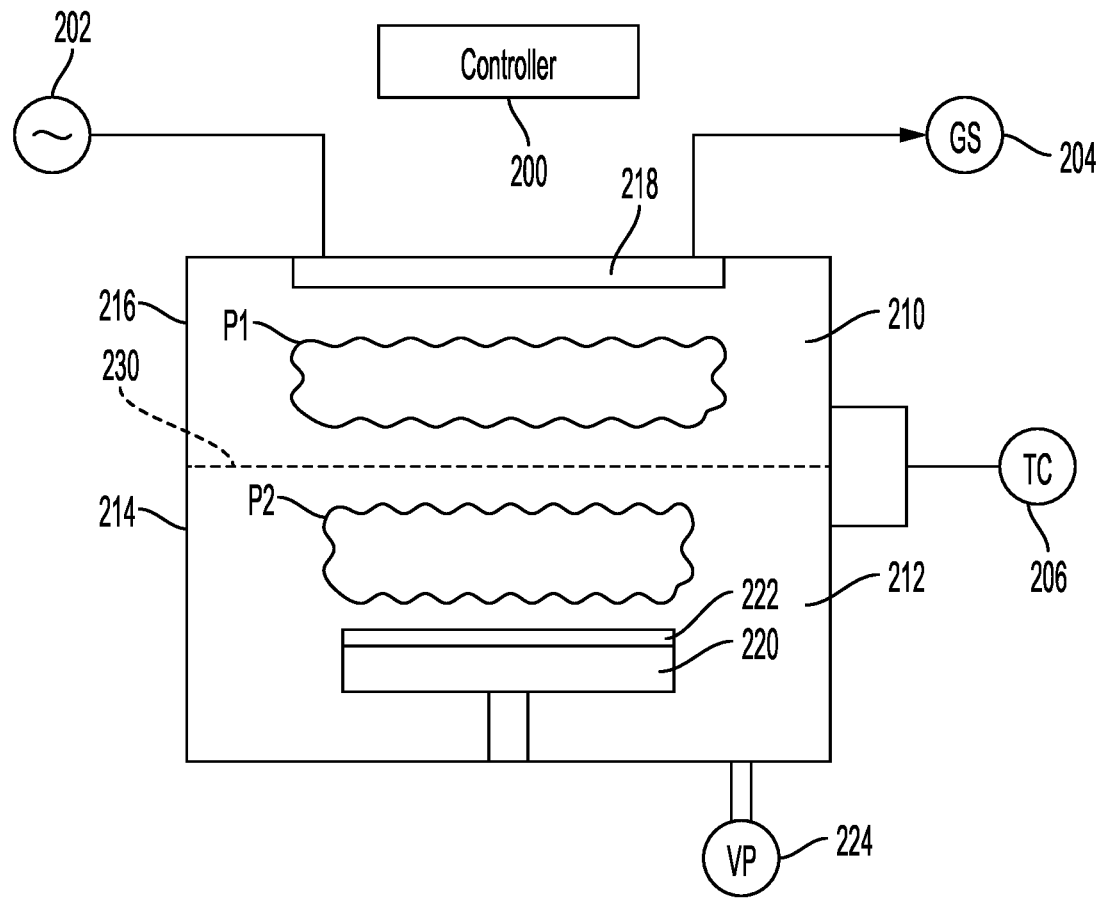
FIG. 2 illustrates an example of an apparatus for treating or modification of a substrate.

Referring to FIG. 2, an example of an apparatus which can be utilized to perform the treatment or pre-treatment using the nitrogen plasma is illustrated. The apparatus is controlled by a controller 200 which controls the apparatus to perform the processes disclosed herein, including control of the power from a power source 202, the supply of gases from a gas supply source GS 204, and the control of temperature by a temperature control system TC 206 which can include one or more heaters. The heaters can be provided in the first chamber (or chamber portion) 210, and optionally could also be provided in the second chamber (or chamber portion) 212 in which the substrate is treated. The heaters can include heaters associated with one or more of the chamber walls 214, 216, and/or with an electrode 218 associated with the chamber or chamber portion 210, and/or heating can also be provided in connection with the substrate holder or substrate support 220, on which the substrate 222 being processed is positioned. The substrate support 220 or other components could also have the components for cooling if desired, e.g., with liquid or gas cooling or heat exchange devices. Plasma process gases are evacuated with a vacuum pump VP indicated at 224. The combination of the gas flow into the system and the evacuation of gases by the vacuum pump can also be used to control the pressure within the apparatus.

The controller 200 can include, for example, one or more processors or computers, and can also include a memory to store e.g., process commands, recipes, recipe data, substrate data or other control data. The control information can also be supplied to the controller 200 from another device or a memory separate from the controller 200. The control and recipe data are preferably stored in a non-transitory computer readable medium. It is also to be understood that, while one controller is identified at 200, one or more sub-controllers or separate controllers can also be provided which operate independently or under commands from the controller 200 to control the various power, gas supply and temperature control equipment and functions to perform processes as described herein.

The gas supply 204 includes a source of nitrogen gas and typically at least one other carrier gas, such as Ar. The additional gas Ar allows for plasma stability and also for varying the concentration of the nitrogen. Preferably, the chambers or chamber portions 210, 212 do not contain an etchant. For example, they do not contain fluorine or another halogen containing gas, during the nitrogen treatment. In addition, in a preferred example, oxygen is also not present. As used herein, reference to a gas or element not being used or not being present means the gas or element is not intentionally added, although trace amounts of materials might be present depending upon the purity of materials used.

Although an electrode is illustrated schematically at 218, other types of plasma generation could be utilized, for example, one or multiple electrode arrangements with one or plural radio frequencies, or with an inductive element at a top or outside of the chamber to provide an inductive power or, for example, microwave components to generate plasma with microwave energy. In an example, power is provided in a range of 300-900 watts to generate the plasma. The gas from the gas source 204 could be supplied through the electrode 218 (e.g., in a showerhead arrangement), and/or through other gas inlets, and the gases can be mixed upstream from the chamber or inside of the chamber 210.

A first plasma schematically represented at P1 is thus formed in the chamber or chamber portion 210. In addition, in the illustrated example, a separator such as a mesh or grid provides a filter or separator 230 which is powered to filter or remove ions (preventing ions from passing therethrough) so that plasma passing from the chamber 210 to the chamber (or chamber portion) 212 passes without ions of the nitrogen passing through the separator or filter 230. As a result, a second plasma schematically represented at P2 will have no ions (or at least fewer ions compared to the plasma P1). In a preferred form, the plasma P2 will have no nitrogen ions, but will include nitrogen radicals which will react to form a nitrogen treated surface or a nitride layer on the Ge layer of the substrate. The arrangement of FIG. 2 can be considered as including separate chambers, or as one chamber including separate chamber portions. In addition, it is to be understood that the plasmas P1 and P2 are represented schematically, because they differ from each other in that the second plasma has had the ions removed. However, rather than appearing as separate distinct plasmas P1 and P2, the first and second plasmas P1 and P2 can appear as continuous extending from the first chamber portion to the second chamber portion, however, the second plasma in the second chamber portion to which the substrate is subjected will be a different plasma or second plasma in that the ions have been removed.

The pressure will be controlled within a range of 10 mTorr-1000 mTorr. The temperature is below 300° C. during the nitrogen radical treatment, and preferably below 150° C. for the nitrogen radical plasma treatment. The temperature is preferably in a range of 0° C. to 100° C., more preferably in a range of 15° C. to 90° C. or 15° C. to 85° C., and even more preferably 20° C. to 85° C. In higher temperatures within the ranges identified, and higher pressures, the reaction will occur more rapidly. However, lower temperatures and pressures within the ranges identified can provide better control, but take a longer amount of time. In general, a higher pressure will decrease the amount of time for saturation to be reached for the layer being treated. Higher temperatures will decrease the amount of time and will also increase saturation levels or the amount of nitriding. Higher temperature can result in a larger thickness of the nitride layer or nitrided surfaces that is formed. If an excessive thickness is formed, it can be difficult to remove the nitriding (for example, in the subsequent etch and heat treatment) where it is desired to eliminate the nitriding after the surface modification and etch have been performed. Therefore, temperatures in the range of 15° C. to 90° C. or 15° C. to 85° C. can be preferred.

The treatment process with nitrogen radicals can be tuned to vary the thickness of the nitride layer formed or the amount of nitriding. The primary control will be based on temperature (with a higher temperature providing a larger nitride thickness on the surface of the Ge layer 104), however pressure and nitrogen gas concentration in forming the plasma can also vary the process. As noted earlier, preferably the Ge containing layer is saturated and has a maximum thickness for a given temperature upon completion of the nitrogen treatment. However, it would also be possible to have a nitride surface which is not fully saturated or does not have a maximum possible thickness or nitrogen content of the surface. The temperature of the substrate on the substrate holder 220 is preferably maintained at the same temperature as the chamber in which the plasma P1 is formed, i.e., the first chamber or chamber portion 210, or at least in the same temperature ranges identified earlier (e.g., 15° C. to 85° C.).

During the subsequent etch process, some of the nitride layer could be removed, however, preferably the nitride layer is sufficiently maintained so that the layer 104 having the highest Ge content is not exposed during the subsequent etching (in other words, at least part of the nitride layer on layer 104 is maintained during etching to prevent etching of the layer 104).

In addition, as noted earlier, the plasma P2 used in the treatment is with radicals and with non-excited species (no ions or a reduced amount of ions) so that there is no (or substantially no) nitriding of silicon, and any nitriding of layers with lower amounts of Ge (compared to layer 104) is substantially lower than layer 104. Nitriding of low Ge alloy amounts of SiGe will be loose or will not bond well (e.g., at Ge amounts of 30% or less), and thus, after the nitrogen treatment, lower alloy SiGe materials will etch well (selectively) compared to pure Ge or SiGe having higher Ge alloy amounts. For lower Ge alloy amounts (e.g., 30% or lower), any nitrogen formed or bonded can be readily removed by the subsequent gas phase etch. For higher Ge alloys or pure Ge, the Ge layer is strongly protected by the nitrogen radical treatment. Therefore, the low alloy SiGe can be etched selective to a higher Ge alloy SiGe or Ge. SiGe can also be etched selective to Si materials, because the nitrogen treatment will not substantially affect the Si material, and the subsequent gas phase chemistry etching will not strongly etch the silicon containing materials having no Ge or very low Ge. Thus, the present processes can be particularly advantageous for SiGe etching with respect to Ge or higher Ge alloys of SiGe, as well as in etching SiGe selective to Si.

Figure 3:
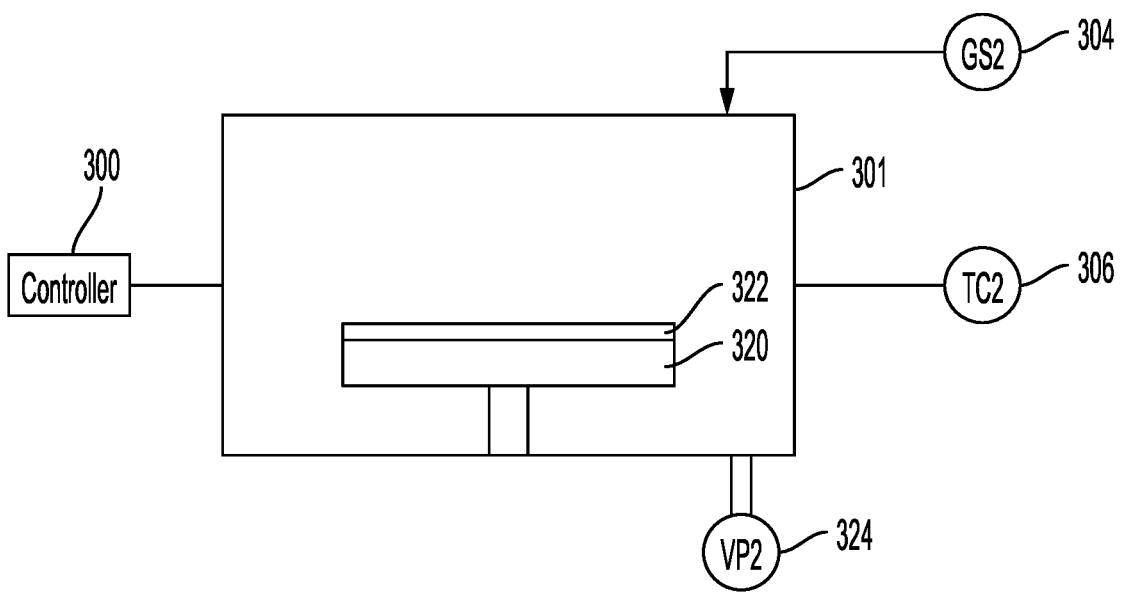
FIG. 3 illustrates an example of an etching apparatus.

After treatment with nitrogen radicals, with a plasma which had nitrogen ions removed, an etching process is performed. Although it would be possible to perform the etching in the same chamber in which the treatment with nitrogen radicals is performed, in a presently preferred example, the etching is performed in a separate chamber 301 illustrated in FIG. 3. The chamber 301 is controlled by a controller 300, which can include one or more processors or computers configured to control the operation and processes performed in the chamber 301. As noted with respect to controller 200, the controller 300 can store instructions or process commands, or can receive instructions or data from a separate memory or controller. As also discussed earlier, controller 300 can be a single controller or can include distributed controllers or sub-controllers to control the various components and operations discussed herein.

A gas supply GS2 shown at 304 controllably supplies process gases from one or more gas sources in instructed concentrations, and the temperature can be controlled by various temperature control expedients as represented at TC2 306, which can include temperature control of the substrate holder 320 and/or of the chamber walls and/or radiant or other forms of temperature control. The substrate 322 is positioned on the substrate holder 320 and can be held, for example, by electrostatic attraction with an electrostatic chuck. A vacuum pump VP2 at 324 is provided to exhaust gases. In a presently preferred example, gases from the gas supply 304 are not excited into a plasma, but rather are provided in a gaseous phase so that the etching is performed by a gas phase chemistry.

The gas phase chemistry will include an etchant such as a fluorine or another halogen, preferably fluorine. Non-limiting examples of preferred etchant gases include $F_2$, $ClF_3$, HF and/or $XeF_2$. Nitrogen and/or Argon gases can also be present but will essentially not react with the substrate layers in the etch process conditions because the gases are not excited.

If a more aggressive fluorine gas phase chemistry is desired, the gases other than HF are preferred, i.e., $F_2$, $ClF_3$ and/or $XeF_2$. As discussed later, after the gas phase etch, preferably a heat treatment is performed. Although the heat treatment can be performed in the same chamber 301 as the gas phase etch chemistry, preferably, a separate chamber is provided which is better for higher temperature control, for example, temperatures from 100° C. to 500° C. Preferably, the temperature is raised after the etching to, for example, 100° C. to 300° C. and more preferably from 150° C. to 250° C. The duration or elapsed time for the heat treatment can vary depending upon the temperature and the amount of residues or other materials which might need to be removed. For example, the heat treatment can be performed for at least 30 seconds and up to, for example, ten minutes. As an example, the heat treatment can be performed for at least one minute or at least two minutes. For the duration of the heat treatment, preferably a fluorine containing gas or other halogen containing gases not introduced into the chamber in which the substrate is positioned. For example, the gases in the chamber during the heat treatment can include inert gases, including N or Ar.

Figure 4:
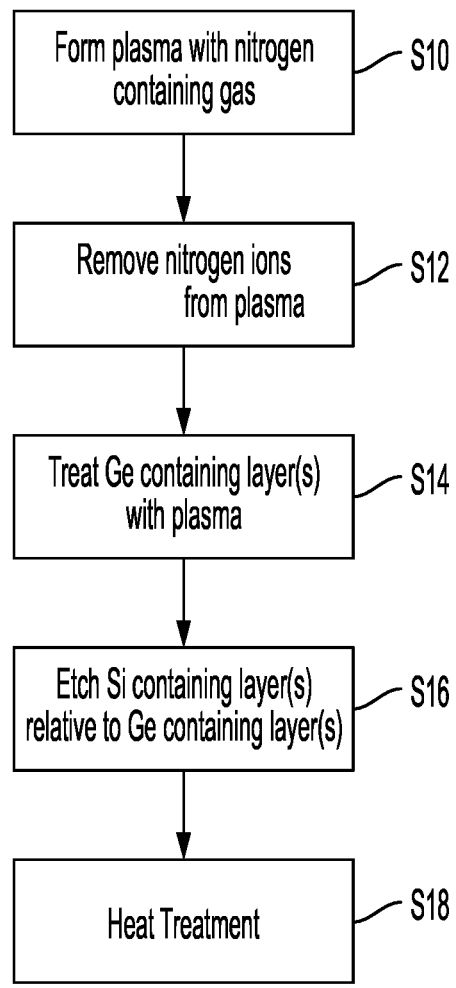
FIG. 4 is a flowchart of a selective etching example.

Referring to FIG. 4, an overview of an example of process steps is provided. The steps refer to the steps and operations discussed herein, and which can be provided as an algorithm under the control of one or more controllers.

As indicated at S10, a plasma (P1) is formed with a nitrogen containing gas, and the gas can include one or more other gases, such as Ar, for plasma stability and/or to control the concentration of nitrogen. In S12, ions are removed from the plasma so that the remaining plasma (or second plasma P2) includes nitrogen radicals, but does not include nitrogen ions, or at a minimum has a reduced amount of nitrogen ions compared to the first plasma. One or more Ge containing layers are then treated with the plasma (P2) after the removal of the nitrogen ions. As discussed earlier, the Ge containing layers can include Si or other materials, however, the amount of Ge (in layer 104) is greater than the amount of Ge of the layer or layers (102) that contain Si that will be etched. The layer 104 can include no Si, and the layer 102 can include no Ge. The layer containing the lower Ge content preferably has less than 50% Ge, and more preferably less than 30% Ge. At Ge contents of below 30%, the nitrogen bonding is loose or minimal and any nitrogen or nitriding can be removed during the gas phase etching, so that the layer 102 containing lower (or no) Ge content is etched with respect to the layer 104 having higher Ge content or which is pure Ge. In step S16, the silicon containing layer is then etched relative to the Ge containing layer.

In S18, a heat treatment is performed. Although the heat treatment is optional, it is presently preferred to achieve improved results. The heat treatment is preferably at a temperature higher than the temperature at which the Ge containing layers are treated with nitrogen radicals and higher than the temperature of the gas phase etch. For example, preferably the temperature for the heat treatment is greater than 100° C.

The heat treatment can remove residues, such as fluorine or halogen containing residues, and can also remove nitrogen containing residues. More aggressive etchant gases (during the gas phase etch) can be beneficial in removing the nitrides during etching or in forming byproducts/residues which are a combination of the etching gases and the nitrogen/nitrides and the etchant(s). The byproducts or residues can also include materials of the Si layer being etched. These byproducts or residues can then be removed during the heat treatment. If more aggressive treatment (and removal of at least some of the nitrides) is desired during the gas phase etch, the etchant gases previously mentioned other than HF are preferred (e.g., $F_2$, $ClF_3$, $XeF_2$).

It is also to be understood that steps can be repeated depending upon the amount of etching performed in a given step or sequence of steps. For example, if additional etching is required after one sequence of S16, S18 these steps can be repeated. In addition, if the nitrogen protection has been depleted, step S14 can be performed again prior to the repetition of S16, S18.

Figure 5:
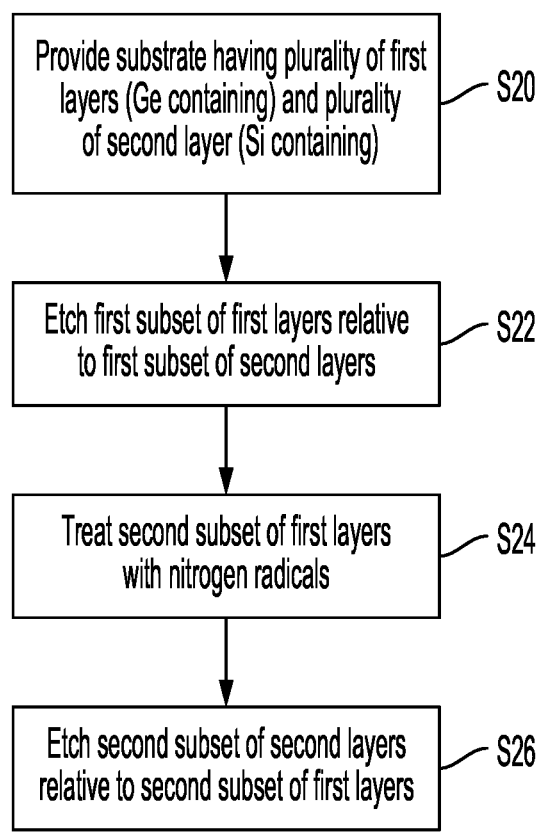
FIG. 5 is a flowchart of a selective etching example.

As indicated in FIG. 5, in accordance with one of the advantageous aspects in which present examples can be utilized, the treatment with nitrogen can be utilized for some Ge containing layers of a substrate, but not others, for example, where it is desirable to selectively etch Ge containing layers (higher Ge alloy layers or pure Ge) relative to Si containing layers (lower Ge alloy layers or layers which do not include Ge) in one part of a process or process flow (or in one portion or a first region of a substrate) and thus, the treatment with nitrogen radicals is not utilized. However, in other portions of a process or different portions of the substrate (e.g., a different second region) or other process steps, it is desirable to etch the Si containing layers selective to or relative to the Ge containing layers, and therefore the treatment with the nitrogen radicals is utilized for the Ge containing layers (layers of all Ge or having a higher percentage of Ge compared to the Si layers) so that the Ge layers are not etched during selective etching of the Si layers.

Accordingly, as indicated at S20, a substrate can be provided having a first plurality of first layers which include Ge, and a second plurality of second layers can be provided which contain Si. As discussed earlier, Ge containing layers can include Si, and the Si containing layers can include Ge, however, the Si containing layers have an amount of Ge which is lower than that of the Ge containing layers. Of course, the Si containing layers might also include no Ge, and the Ge containing layers could include no Si. In preferred examples, where a Si containing layer is etched selective to a Ge containing layer, and both layers include Ge, the Si containing layer will preferably have less than 30% Ge, preferably 5% to 30% Ge. However, for certain devices, it might be desired to have no Ge in the device, for example to provide a pure Si channel. The Ge containing layer will have a larger amount of Ge, preferably greater than 30%, more preferably greater than 50% Ge, and can be pure Ge. Other variations are possible where the Ge containing layers have a higher Ge content than the Si containing layers.

In the example of FIG. 5, a first subset of first layers containing Ge is selectively etched relative to a first subset of the second layers containing Si, and therefore, the Ge containing layers of the first subset are not provided with the treatment or pre-treatment with nitrogen radicals. The Ge containing layers of the first subset can thus be etched selective to or relative to the first subset of the second layers by, for example, a fluorine containing gas such as a gas phase etch including at least one of $F_2$, $ClF_3$, HF and/or $XeF_2$. Thus, according to one of the advantages, the same or substantially the same gas phase etch process can be used to etch a Ge containing layer relative to or selective to an Si containing layer, and also for etching an Si containing layer relative to or selective to a Ge containing layer, with the difference being whether the pre-treatment with nitrogen radicals is used.

A second subset of the first layers (the Ge layers) is then treated with nitrogen radicals as indicated at S24, with the processing as discussed earlier so that a nitride layer is provided to protect the Ge containing layers of the second subset. A second subset of the second layers (Si containing layers with lower Ge) is then etched relative to the second subset of the first layers as indicated at S26. Although pure Si (or Si containing very low or no Ge) will etch slowly, it can nevertheless be etched relative to or selective to a Ge layer where the Ge layer is protected with the treatment with nitrogen radicals as discussed earlier.

The order of the processing in FIG. 5 is provided as an example, and as an alternative, a first subset of the first layers (Ge containing layer) can be treated with the nitrogen radicals to provide etching of the first subset of second layers (Si containing layers) relative to the first subset of the first layers with the gas phase etching. Thereafter, a second subset of the first layers is not treated with the nitrogen radicals so that the second subset of the first layers containing Ge are then etched relative to the second subset of the second layers containing Si.

Similarly, although the treatment with nitrogen radicals discussed in connection with FIGS. 1A-C was discussed in relation to treating the Ge and then indenting by etching the Si containing layers, the materials could be reversed or provided in connection with additional materials or process steps. For example, in the arrangement of FIGS. 1A-C, the Ge containing layer could be etched to form indentations relative to the Si containing layers without treating or pre-treating the Ge containing layers, and thereafter (or prior thereto), a process can be performed in which the Si containing layers are etched relative to the Ge containing layers. In this case, the Ge containing layers are provided with the treatment with nitrogen radicals prior to performing the etch of the Si containing layers relative to or selective to the Ge containing layers. If a Ge containing layer and a Si containing layer are exposed at the same time, little or no etching of the Si containing layer will occur during etching of the Ge containing layer, particularly where the Si containing layer contains very low amounts of Ge or no Ge, as the Ge containing layer will etch rapidly. Thus, where it is desired to selectively etch Ge with respect to Si, and also selectively etch Si relative to Ge, the Ge containing layer can first be etched to provide a desired etch amount, and because the Ge layer etches rapidly, there will be little or no etching of the Si layer. Thereafter, the Ge layer can be protected, and the Si layer can be etched. Although the progress of the Si layer will be slower (compared to unprotected Ge), the etching can progress to the desired amount without affecting the previously etched Ge layer because the treatment has been performed on the Ge layer.

As indicated earlier, in connection with FIG. 4, the process as illustrated in FIG. 5 can also be provided as an algorithm which an apparatus will perform under the control of one or more controllers. The FIG. 5 process will preferably also include a heat treatment after the gas chemistry etch.

Figure 6:
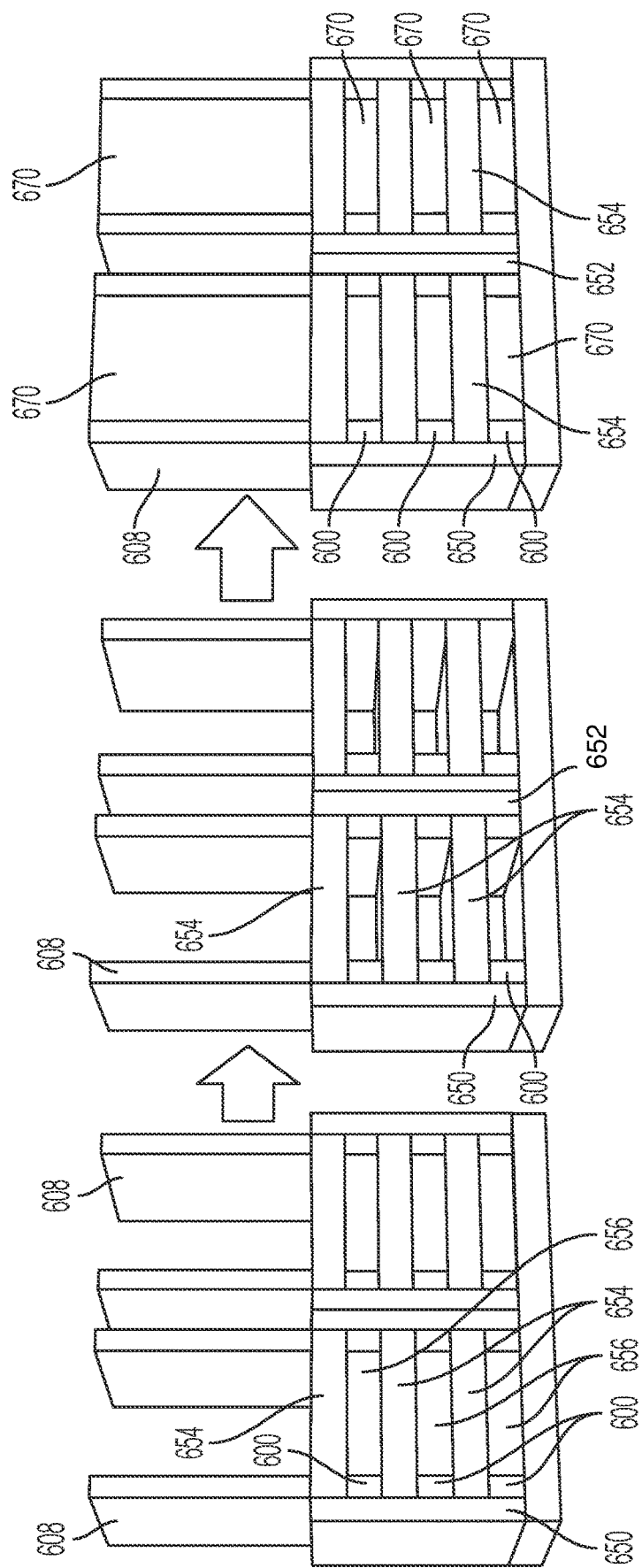
FIGS. 6A-6C illustrate a channel release etching example.

FIGS. 6A-6C provide another example in which the present processing can be utilized.

FIG. 6A illustrates an arrangement in which spacers 600 have been provided in indentations previously formed, and in addition, a source 650 and a drain 652 have been provided on each side of the stack assembly. A channel 654 extends from the source 650 to the drain 652, with the channels separated by layers 656. As illustrated in FIG. 6B, the channels 654 are then released by removal of the layers 656. In this operation, where the layers 654 are Ge containing layers (pure Ge or Ge in an amount higher than layers 656), they can be treated with the nitrogen radicals as discussed earlier herein, so that upon removal of the layers 656, the Ge layers 654 are protected. Alternately, where the layers 656 have the higher germanium content, this process can be performed without utilizing the nitrogen radical treatment of the layers 654, and the layers 656 are etched without pre-treatment of layers 654. This later example could be utilized in a process in which other upstream or downstream processes selectively use protection of Ge layers with the nitrogen radical treatment.

After the channel release, as shown in FIG. 6C, a gate metal 670 is deposited between the gate spacers 608 and in the regions between the channels 654. Preferably, a barrier layer is deposited prior to deposition of the gate metal 670. Here, one of the layers (or sets of layers) 654 or 656 could have been previously treated with the nitride treatment, but the nitride treatment was then removed in another process operation, e.g., in an earlier etch. Thus, the processing with the nitride treatment or pre-treatment can be utilized with certain process operations, but not utilized in other process operations selectively. As a result, selective etching of both Ge with respect to a lower Ge alloy (or containing no Ge) can be performed, and also, selective etching of a lower Ge alloy (or containing no Ge) can also be performed relative to a higher Ge alloy layer, depending upon use and non-use of the pre-treatment.

According to methods herein, different selectivities can be used in different features or devices in different regions of a substrate. The selective etching of Ge containing layers relative to an Si containing layers (containing a lower amount of Ge or no Ge) in one portion of a substrate or a first region of a substrate, while providing the reverse selective etching in another portion or second region of a substrate, i.e., selective etching of Si layers (containing no Ge or containing lower amounts of Ge) with respect to a Ge containing layer, can be provided, for example, in two ways. For example, briefly referring to FIGS. 10A and 10B, different devices or device features can be provided in different regions of a substrate, for example, with devices 700 provided in a first region of a substrate and devices 500 provided in a second region of a substrate. Devices 500 in the second region of the substrate can be covered, for example, with a layer 600, such as an organic layer or an OPL, for example. The devices 700 and 500 will typically also include a liner, for example as illustrated at 702, 502, to avoid damage during depositing of the film 600. The liner or layer 702 can be removed so that the devices 700 are exposed as illustrated in FIG. 10B, while the devices 500 in the second region of the substrate remain covered. The devices or device features in the first region 700 can thus be processed, e.g., using the treatment with the nitrogen radicals so that Si containing layers can be etched. For example, where devices or features in the first region 700 include Ge channels, the Ge channels can be protected and the layers between the channels can be etched and removed to provide a channel release, while the Ge channels in the first region are not etched due to the protection with the nitrogen radical treatment. In the same substrate, other devices can include channels formed of an Si material containing no Ge or a lower amount of Ge compared to materials of the layer or layers between the channels. Thus, the devices or features 700 can be covered with a film, for example, a carbon containing film such an OPL, and the devices or features 500 are exposed upon removal of the layer or film 600 in the second region. The Ge layers between the channels (with the channels formed of Si containing no Ge or lower alloy amounts of Ge compared to the Ge layers) can then be etched to provide a channel release without the pre-treatment for the features or devices 500 in the second region.

Figure 10A:
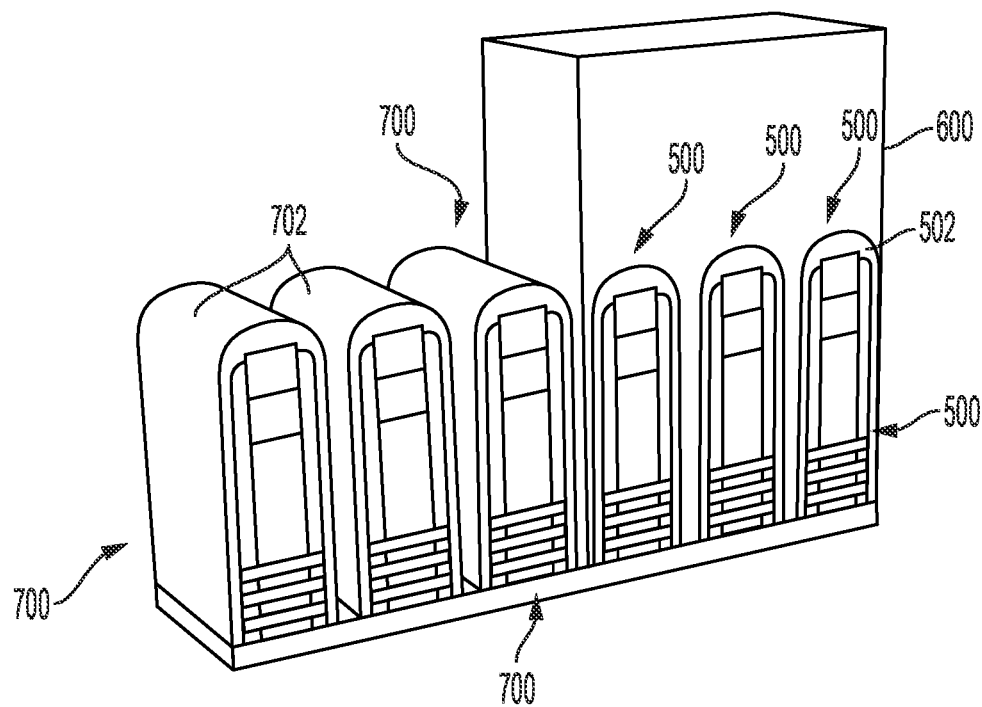
FIGS. 10A and 10B illustrate an example of selective processing of different portions or regions of a substrate.
Figure 10B:
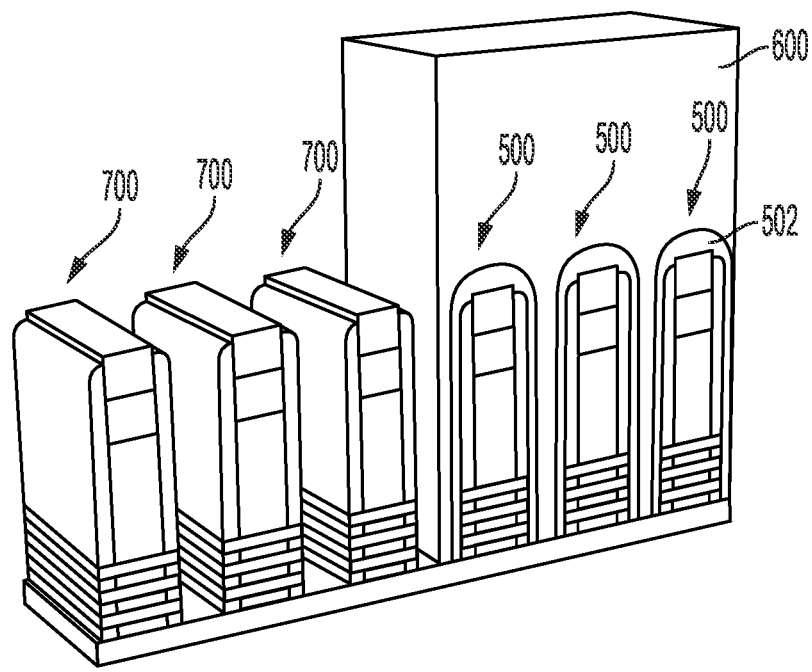

In the example shown in FIGS. 10A and B, the indent process has already been performed and spacers formed. However, the same approach can also be used with an indent process where different materials are indented in different regions of the substrate. Si layers can be indented in features or devices of a first region while Ge layers in the first region are protected using a nitrogen radical treatment, and devices or features in the second region are covered. With devices or features in the first region covered and the second region uncovered, Ge layers of the second region can be etched (e.g., to indent the Ge layers) without performing the nitrogen radical treatment.

A further example is provided below in which two different devices or features can be exposed at the same time in different regions of the substrate, and the selective use (or non-use) of the nitrogen treatment and the timing of the nitrogen treatment can be utilized to provide different selective etching of different materials in the different regions.

Figure 7:
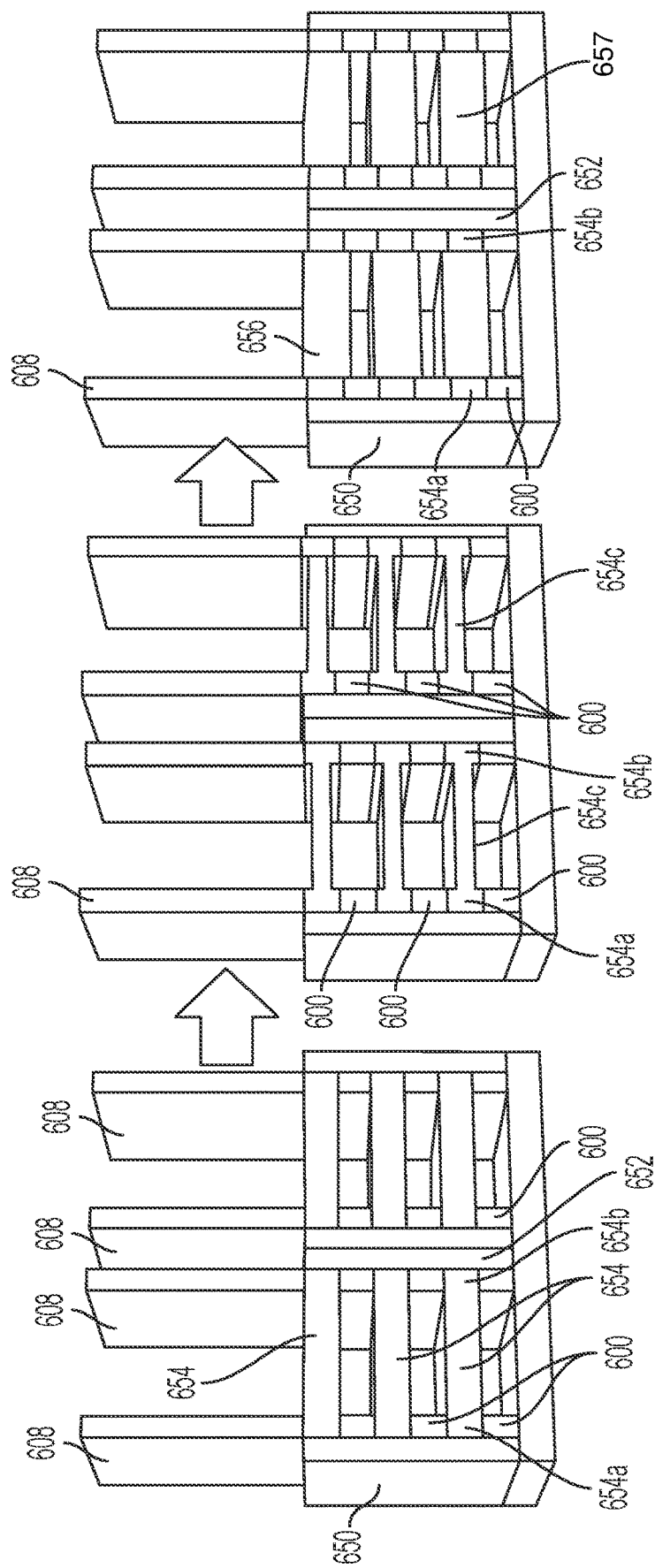
FIGS. 7A-7C illustrate a channel trim etching example.

FIGS. 7A-7C illustrate another example in which the present processing with nitrogen radicals can be utilized, in this operation, or in the context of plural process operations in which the nitride treatment is provided in other operations. In the arrangement of FIGS. 7A-C, a channel trim and cladding operation is performed. Reference numbers used in FIGS. 6A-C are the same as FIGS. 7A-C, unless otherwise noted, and thus their description is not repeated.

FIG. 7A illustrates channels 654 after they have been released with layers 656 removed. The channels each include a first end 654a and a second end 654b, where spacers 600 are provided adjacent (above and below) each of the first and second ends 654a, 654b. As shown in FIG. 7B, a channel trimming or channel thinning operation is performed so that portions 654c between the first and the second ends 654a, 654b are trimmed or thinned.

Next, as shown in FIG. 7C, a channel cladding operation can be performed in which a cladding material is deposited or wrapped around all of the surfaces of the channel 654 that are exposed, including the portions which have been previously trimmed at 654c, to provide a cladding 657. For example, the cladding can be formed by growing an Si, Ge or SiGe layer 657 on the trimmed channel 654.

By way of example, in an earlier etch (such as a channel release), the channels 654 can be protected, and the Si material between the channels etch. The nitriding is removed, and the channels can be etched with a fluorine gas phase etch but without performing the nitrogen radical treatment before performing the channel trim.

According to another example, a given substrate can include devices in a first region with channels (first channels) which are formed of a Ge containing layer (all Ge or a higher alloy SiGe), and devices in a second region can have other channels (second channels) which are Si layers (e.g., having a lower Ge alloy amount compared to the Ge layers or not including Ge). The etching or trimming of the Si layers can be performed while protecting the Ge layers (using the nitrogen radical treatment) in one region, and the etching (e.g., trimming) of the Ge layers can be performed in a separate etch process without protection (without using the nitrogen radical treatment) in another region.

As discussed earlier in connection with FIGS. 10A and 10B, where different devices or features are provided in which different selectively is desired, one region of the substrate can be covered while another region is processed using the treatment with nitrogen radicals, and then the other region can be covered while uncovering the region initially covered, and the reverse selectivity can be utilized by not using the treatment with nitrogen radicals.

The channel trim operation is an example of processing in which two different types of devices can be exposed at the same time (without requiring selective covering and uncovering, e.g., with an organic layer), and the selective use (or timing of use) of the treatment with nitrogen radicals can be utilized to provide selective trimming of different types of channel materials. For example, in a first region of the substrate, first devices or features are provided in which first channels are formed of a Ge material (pure Ge or Ge in an amount higher than channels of the devices or features of the second region of the substrate), and the second region of the substrate has second devices having second channels formed of different channel materials than the first channels in the first region (such as Si material that does not include Ge, or a Si material that includes Ge in an amount lower than the channels of devices of the first region). With such an arrangement, with first devices of the first region and the second devices of the second region both exposed, etching can be first performed without the treatment with nitrogen radicals. In this case, the Ge channels (first channels) of the first region will etch rapidly to obtain the desired etch or trim amount, because the Ge etches rapidly in the gas phase chemistry etch. Thereafter, the treatment with nitrogen radicals is performed so that the Ge channels of the first devices of the first region are protected. The second channels of the second region can then be etched or trimmed to the desired trim amount while the first channels are protected by the nitrogen radical treatment. Although during the etching of the Ge channels (first channels) of the first region, etching of the second channels of the second region may have also occurred, any etching would be minimal and they have not been etched to the desired trim amount, due to the slowness of the etching of the second channels in the second region of the substrate. The first channels are then treated so that, after the treatment with nitrogen radicals of the Ge channels (first channels), they are protected to maintain the previously obtained desired trim amount. The etching of the Si layers or Si channels (second channels) in the second region can then proceed in a second etching operation. Although this etch will be relatively slow, the Ge layers or channels of the first region that were previously etched are maintained without further etching due to the use of the treatment with nitrogen radicals, and the etching of the second channels of the second region can proceed until the desired etch or trim amount is obtained. Thus, by the selective use and non-use of the nitrogen radical treatment, different devices or features formed of different materials in different regions of a substrate can be etched with different selectivities. The use and non-use of the treatment with nitrogen radicals can be advantageously applied to nfet and pfet applications.

Figure 8:
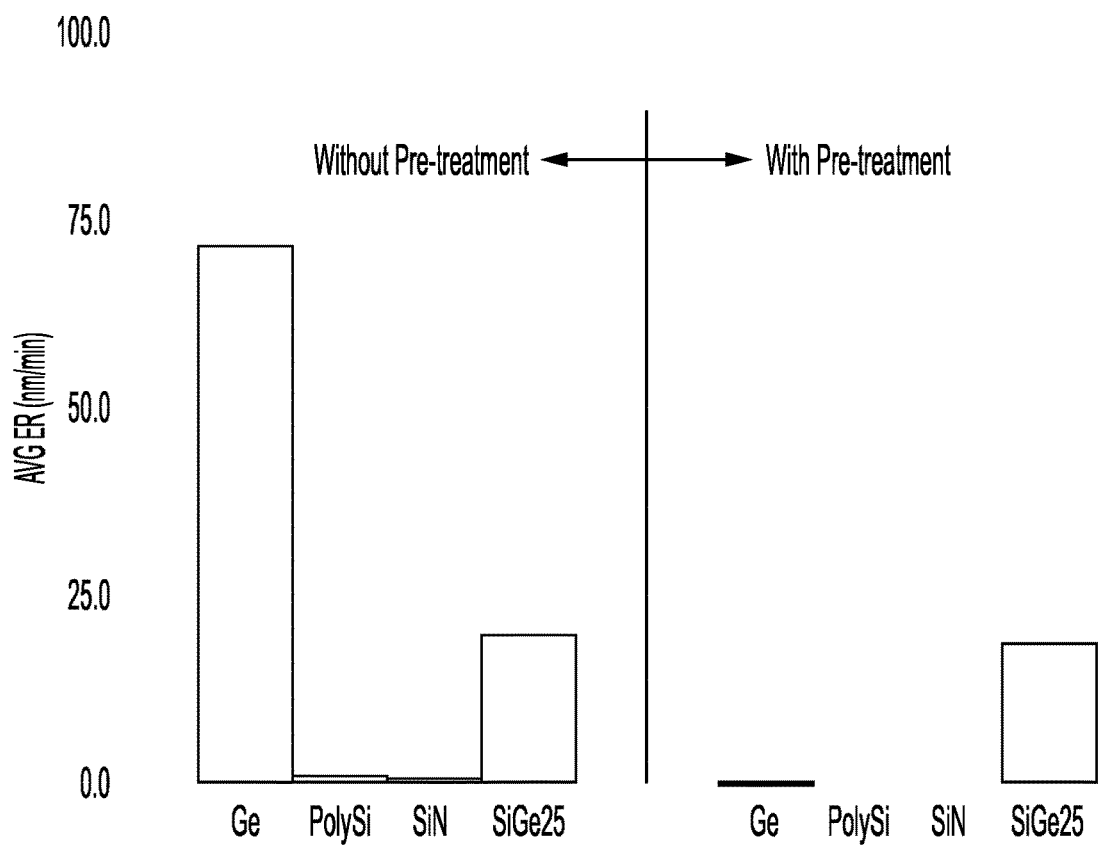
FIG. 8 is a graph illustrating change of selectivity by use or non-use of treatment or pre-treatment.

FIG. 8 illustrates an advantageous selectivity, and selectivity modification, that can be achieved with the nitrogen radical treatment disclosed herein. Specifically, each of four materials were subjected to the same gas phase etching process (non-plasma etch with a fluorine containing gas), where the left portion of the graph identifies etch rates without pre-treatment with nitrogen radicals, and the etch rates at the right portion of the graph illustrates etch rates with the same gas phase etch process but with the etch pre-treatment with nitrogen radicals as disclosed herein. For the example shown, the nitrogen radical treatment was performed at 85° C. As can be seen, where the pre-treatment was not performed, the Ge layer etches rapidly relative to a layer which contains both Si and Ge (for example, the SiGe25 layer indicated, which is 25% Ge). The Ge also etches rapidly relative to polysilicon and SiN.

By contrast, where the pre-treatment is utilized (the right portion of the graph), the Ge is not etched or minimally etched, demonstrating the effectiveness of the treatment. Further, where selective etching of a material containing SiGe (such as a 25% alloy) is desired, etching can be provided which is highly selective to etch SiGe selective to or relative to Ge. Using the process gases in a gas chemistry etch, the poly-Si or SiN (deposited by low pressure CVD in the example) had very low etch rates without the pre-treatment, and also with the pre-treatment. Thus, using the same etch chemistry during a gas phase etch, and not using the nitrogen radical treatment, a highly selective etch of Ge layer relative to a layer having a lower Ge content can be provided, with the etch also highly selective relative to other silicon containing materials, such as poly-Si or SiN, as indicated by the left portion of FIG. 8. Further, by utilizing the pre-treatment, the Ge layer exhibited substantially no etching, so that SiGe can be etched relative to Ge (or other Si containing layers which have a lower or no amount of Ge, e.g., poly-Si or SiN). Accordingly, using essentially the same gas phase etch, a Ge (higher Ge amount) containing layer can be etched selectively relative to a SiGe layer having a lower Ge amount, or alternatively, a SiGe layer can be selectively etched relative to a Ge layer with a gas phase etch chemistry (e.g., with a fluorine or halogen gas such as a $F_2$, $ClF_3$, HF and/or $XeF_2$), depending upon whether the nitrogen radical treatment is used or not used.

Thus, for example, where a substrate includes different devices or different features respectively in first and second regions of the substrate, etching of Ge containing layers can be performed for first devices in the first region by not utilizing the treatment with nitrogen radicals. Thereafter, treatment with nitrogen radicals can be utilized and etching of Si layers having lower amounts of Ge or no Ge can be performed while the Ge layers or (e.g., first channels) are protected.

Figure 9:
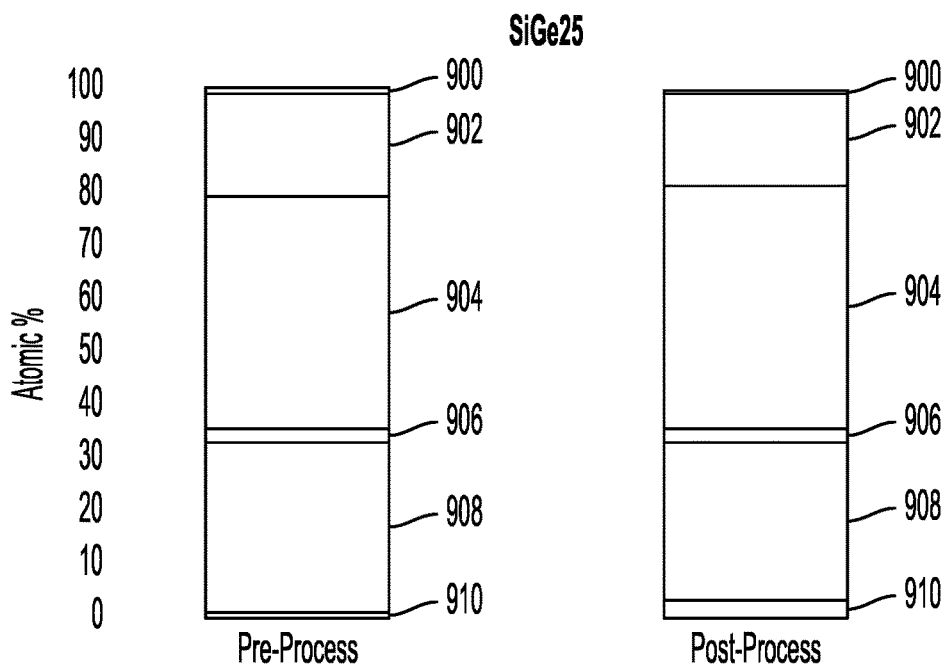
FIG. 9 is a graph illustrating reversibility of the treatment and nitrogen effects.

FIG. 9 illustrates that the use of the nitrogen radical treatment is substantially reversible or will not damage the material subjected to processing. In other words, after the nitrogen radical treatment, selective gas phase etch, and heat treatment, the material (SiGe25 in the example of FIG. 9) substantially returns to its original state. Thus, the nitrogen radical treatment can be used without damaging or substantially changing the properties or composition of the material. In the two graphs of FIG. 9, the atomic percentages of different materials are indicated before processing (before being subjected to the nitrogen radical treatment) in the left, and also after processing, i.e., after radical nitrogen treatment, gas phase etching and heat treatment. The test was performed with the SiGe25 formed as a film on top of a substrate, and the composition of the film determined before and after processing. Although the film is nominally silicon and 25% germanium, other materials are present. The pre-treatment was performed with nitrogen radicals (with a remote plasma and ions removed as illustrated in FIG. 2), at 85° C., a pressure of 850 mTorr, source power of 850 watts, and a volumetric gas flow rate of 75% nitrogen and 25% argon to the remote plasma chamber. The gas phase chemistry etch was performed at 60° C., 250 mTorr, a volumetric flow rate of fluorine etchants of 50% ($F_2$ and $ClF_3$) and 50% carrier gases (N and Ar). The post etch heat treatment was at 2 Torr and 150° C. in a nitrogen and argon environment. As can be seen, only a slight reduction in the carbon content (the material 900) is observed. In addition, a slight increase in the amount of flourine (indicated by the lower material 910) is also observed but is small. However, the amounts of Ge (region 902), Si (region 904), nitrogen (region 906), and oxygen (region 908) are essentially the same. Thus, the treatment or pre-treatment with nitrogen radicals can be utilized to effectively provide a selective etch or to vary the amount of selectivity of one material relative to another, but the treatment does not substantially change the composition of the material treated or damage the material. With the present methods, changes in the atomic percentages of each of oxygen, germanium and silicon will be 5% or less comparing the composition after processing with the composition prior to processing with respect to the material being selectively etched and with respect to the material protected with nitrogen radical treatment. In addition, surface damage can also be avoided or minimized, due to the removal of ions prior to treating the material so that the pre-treatment modification is with nitrogen radicals and without excited species, and also by performing the etch with the gas phase etch chemistry.

The disclosed method and apparatus can be utilized in various applications, including but not limited to nfet, pfet, nanosheet, GAA, finfet, CFET, and other devices or device features.

It is to be understood that modifications and variations can be incorporated consistent with the teachings herein. It is therefore to be understood that within the scope of the present claims, the invention can be practiced otherwise or with variations with respect to the examples disclosed herein.

The invention claimed is:

1. A method of etching comprising:
   providing a substrate having a base, a first layer above the base and a second layer above the base, wherein the first layer comprises Ge, and the second layer comprises Si, the second layer either including no Ge or Ge in an amount less than the first layer, and wherein the first and second layers are vertically stacked such that one of the first and second layers is vertically above the other of the first and second layers;
   treating a side surface of the first layer with nitrogen radicals to form a nitrided surface on the side surface of the first layer; and
   etching a side surface of the second layer while the side surface of the first layer is protected with the nitrided surface to indent the side surface of the second layer with respect to the side surface of the first layer and thereby provide an indentation in the second layer.

2. The method of claim 1, further including filling the indentation of the second layer with a spacer material.

3. The method of claim 1, wherein the treating the side surface of the first layer comprises:
   forming a first plasma in a first chamber or first chamber portion with a gas comprising nitrogen,
   removing nitrogen ions from the first plasma while feeding the plasma to a second chamber or second chamber portion in which the substrate is positioned to provide a second plasma in the second chamber or second chamber portion, and
   treating the side surface of the first layer with the second plasma after removing nitrogen ions to treat the side surface of the first layer with nitrogen radicals in the second plasma.

4. The method according to claim 3, wherein the treating of the side surface of the first layer is selective with respect to the second layer, and wherein after the treating and before the etching the second layer will have either no nitriding or less nitriding than the first layer as a result of the treating, less nitriding meaning at least one of: (a) the second layer having a nitrided surface which is thinner than the nitrided surface of the first layer, or (b) the second layer having a nitrided surface having a lower nitrogen concentration compared to the nitrided surface of the first layer.

5. The method according to claim 4, wherein the first layer has a Ge content greater than 30% and the second layer has a Ge content in a range of from 5% to 30%;

wherein the treating is performed at a temperature in a range from 15° C. to 90° C., and the treating is performed without introducing a halogen containing gas into the first chamber or first chamber portion;

wherein the etching comprising a gas phase chemistry etch without a plasma, the gas phase chemistry etch including a fluorine containing gas; and wherein the method further comprising, after the etching, raising a temperature of the substrate to perform a heat treatment at a temperature in a range from 100° C. to 300° C., and wherein the heat treatment is performed without introducing a fluorine containing gas.

6. The method according to claim 5, further including performing the etching and the heat treatment in separate chambers.

7. The method of claim 1, further including removing the nitrided surface from the first layer.

8. The method according to claim 1, wherein the etching comprises a gas phase non-plasma etch with a gas comprising at least one of $F_2$, $ClF_3$, HF or $XeF_2$;

the method further including, after the etching, performing a heat treatment at a temperature in a range from 100° C. to 300° C., and wherein a fluorine containing gas is not introduced during the heat treatment.

9. The method according to claim 8, further including etching a third layer selective to a fourth layer on the substrate, the third layer having a Ge content higher than the fourth layer, the etching of the third layer including performing a gas phase non-plasma etch with a fluorine containing gas including at least one of $F_2$, $ClF_3$, HF or $XeF_2$ to selectively etch the third layer with respect to the fourth layer, and wherein prior to beginning the etching the third layer, the third layer and the fourth layer are exposed, and a nitrogen radical treatment is not performed on the third layer or the fourth layer.

10. The method of claim 8, wherein a change in a composition of a material of the first layer and a material of the second layer after the heat treatment compared to before the treatment with nitrogen radicals is 5% or less with respect to each of silicon, germanium and oxygen.

11. The method of claim 1, wherein:

the substrate includes a first plurality of the first layers and a second plurality of the second layers, and wherein some of the first plurality of first layers are treated in the treating of the side surface, some of the second plurality of second layers are selectively etched with respect to said some of the first plurality of first layers, and others of the first plurality of first layers are not treated, the method further including etching the others of the first plurality of first layers selective to others of the second plurality of second layers without treating the others of the first plurality of the first layers or the others of the second plurality of the second layers with nitrogen radicals.

12. The method of claim 1, wherein the treating the side surface of the first layer includes treating two side surfaces of the first layer, and the etching the side surface of the second layer includes etching two side surfaces of the second layer to form two indentations at opposite sides of the second layer which are indented with respect to the first layer;

the method further including:
filling the two indentations with a spacer to provide spacers in the two indentations;

removing the second layer, to leave a channel formed from the first layer, the channel including first and second ends with one of the two spacers adjacent the first end and another of the two spacers adjacent the second end;

trimming a portion of the channel to form a thinned channel portion at a location between the first and second ends; and forming a cladding around the thinned channel portion.

13. The method of claim 12, wherein the substrate includes a first region and a second region, and wherein the first layer and the second layer are part of a first device located in the first region and the channel of the first device is a first channel;

the substrate further including a second device in the second region, the second device including a third layer and a fourth layer, the fourth layer including Si and either no Ge or Ge in an amount less than the first layer, the method further including removing the third layer so that a second channel is formed by the fourth layer, wherein during the trimming of the portion of the first channel, the second channel is exposed, and the first channel is selectively etched with respect to the second channel;

the method further including, after trimming of the portion of the first channel, treating the first channel with nitrogen radicals of a channel treatment plasma, in which nitrogen ions have been removed to form the channel treatment plasma, to provide a treated trimmed first channel; and after treating the first channel, selectively etching the second channel with respect to the treated trimmed first channel to provide a trimmed second channel.

14. A method of etching comprising:

providing a substrate which includes a first plurality of first layers and a second plurality of second layers, wherein the first plurality of first layers each comprises Ge, and the second plurality of second layers each comprises Si, and wherein the second plurality of second layers either contains no Ge or contains less Ge than each of the first plurality of first layers;

treating a first subset of the first plurality of first layers with a plasma which includes nitrogen radicals to provide nitride layers on sides of each of the first subset of the first plurality of first layers; and etching a first subset of the second plurality of second layers selective to the first subset of the first plurality of first layers.

15. The method of claim 14, further including not treating a second subset of the first plurality of first layers with nitrogen radicals, wherein the second plurality of second layers includes a second subset of the second plurality of second layers, the method further including etching the second subset of the first plurality of first layers selective to the second subset of the second plurality of second layers without treating the second subset of the first plurality of first layers.

16. The method of claim 15, wherein the first subset of the first plurality of first layers and the first subset of the second plurality of second layers are provided in a first device in a first region of the substrate;

wherein the second subset of the first plurality of first layers and the second subset of the second plurality of second layers are provided in a second device in a second region of the substrate different from the first region; and wherein selective etching of lower Ge containing layers with respect to higher Ge containing layers in the first region is provided by treating the higher Ge containing layers in the first region to form nitrides, and selective etching of higher Ge containing layers with respect to lower Ge containing layers is provided in the second region by not treating the second region to form nitrides.

17. The method of claim 16, wherein the treating of the first subset of the first plurality of first layers comprises:

forming a first plasma with a gas containing nitrogen;

removing nitrogen ions from the first plasma to form a second plasma, the second plasma including nitrogen radicals but having either no nitrogen ions or a reduced amount of nitrogen ions compared to the first plasma; and treating the first subset of the first plurality of first layers with the second plasma.

18. A substrate processing method comprising:

providing a substrate having a first feature and a second feature, the first feature comprising a first layer and a second layer, the first layer comprising Ge in an amount greater than 30%, the second layer comprising Ge in an amount greater than 5% and less than 30%, and the second feature comprising a third layer and a fourth layer, the third layer comprising Ge, and the fourth layer comprising Si, wherein the fourth layer includes either no Ge or Ge in an amount lower than the third layer;

(a) etching the second layer of the first feature selective to the first layer by a first process in which at a beginning of the first process, surface portions of both the first layer and the second layer are exposed, the first process comprising:

(i) forming a first plasma with a gas comprising nitrogen, and wherein the first plasma is formed without halogen containing gases;

(ii) removing ions from the first plasma to provide a second plasma having nitrogen radicals;

(iii) exposing the first feature to the second plasma, the exposing selectively treating the first layer with respect to the second layer with nitrogen radicals of the second plasma, and wherein the exposing and selectively treating is at a temperature in a range from 15° C. to 100° C.; and (iv) after the exposing, performing a gas phase chemical etch in a non-plasma environment comprising at least one halogen gas to selectively etch the second layer with respect to the first layer; and (b) etching the third layer of the second feature selective to the fourth layer of the second feature with a second etch process in which at a beginning of the second etch process portions of both the third layer and the fourth layer are exposed, the second etch process comprising:

(i) a gas phase chemical etch in a non-plasma environment comprising at least one halogen gas to selectively etch the third layer with respect to the fourth layer; and (ii) prior to performing the gas phase chemical etch, the second feature is not exposed to a treatment with nitrogen radicals.

19. The method of claim 18, wherein:

the third layer comprises Ge in an amount greater than 30%, and the fourth layer comprises less than 30% Ge;

the gas phase chemical etch of (a) (iv) includes at least one gas selected from $F_2$, $ClF_3$, HF or $XeF_2$;

the gas phase chemical etch of (b) (i) includes at least one gas selected from $F_2$, $ClF_3$, HF or $XeF_2$;

the method further comprising:

after performing the gas phase chemical etch of (a) (iv), performing a heat treatment of the first feature with a temperature in a range of 100° C. to 250° C., wherein the heat treatment of the first feature is performed in an environment in which a fluorine containing gas is not introduced during the heat treatment; and after performing the gas phase chemical etch of (b) (i), performing a heat treatment of the second feature with a temperature in a range of 100° C. to 250° C., wherein the first region includes a first device which includes the first feature and the second region includes a second device which includes the second feature.

20. The method of claim 18, wherein the substrate includes a first region and a second region, separate from the first region, and wherein the first feature is part of a first device in the first region and the second feature is part of a second device in the second region.

* * * * *